United States Patent [19]
Nayebi

[11] Patent Number: 5,291,074
[45] Date of Patent: Mar. 1, 1994

[54] BICMOS TRACK AND HOLD AMPLIFIER

[75] Inventor: Mehrdad Nayebi, Palo Alto, Calif.

[73] Assignee: Vanguard Semiconductor, a division of CA Micro Devices, Milpitas, Calif.

[21] Appl. No.: 506,033

[22] Filed: Apr. 5, 1990

[51] Int. Cl.$^5$ .................. H03K 5/159; H03K 17/687; H03K 5/00

[52] U.S. Cl. ..................... 307/353; 307/572; 328/151

[58] Field of Search ............... 307/352, 491, 494, 570, 307/572, 443, 353, 257, 321; 328/151

[56] References Cited

U.S. PATENT DOCUMENTS

| | | | |
|---|---|---|---|
| 3,753,132 | 8/1973 | Hill | 307/572 |
| 4,323,796 | 4/1982 | Lathrope | 307/572 |
| 4,404,479 | 9/1983 | Toyomaki | 307/353 |
| 4,410,855 | 10/1983 | Underhill et al. | 307/353 |
| 4,484,089 | 11/1984 | Viswanathan | 307/353 |
| 4,585,956 | 4/1986 | Lie | 307/572 |
| 4,716,398 | 12/1987 | Eccleston et al. | 307/572 |
| 4,752,703 | 6/1988 | Lin | 305/572 |

FOREIGN PATENT DOCUMENTS

0913593 3/1982 U.S.S.R. ................ 307/353

Primary Examiner—Jin F. Ng
Assistant Examiner—Sinh Tran
Attorney, Agent, or Firm—Flehr, Hohbach, Test, Albritton & Herbert

[57] ABSTRACT

A BiCMOS track and hold amplifier provides improved features of pedestal cancellation and feedthrough reduction. A further aspect of the present invention for multi-purpose functional (operational) capabilities, such as an operational amplifier, a track and hold configuration, an emitter follower, or a cable driver type configuration, based upon common architecture.

13 Claims, 9 Drawing Sheets

BICMOS TRACK AND HOLD AMPLIFIER

BACKGROUND OF THE INVENTION

The present invention relates to BiCMOS and bipolar track and hold amplifiers.

The ability to track and then sample an analog waveform is often an essential function in the signal acquisition interfaces for digital video systems and high speed instrumentation. In such interfaces, analog signals must often be samples and stored accurately prior to quantization by either sequential or parallel means. In sequential A/D converters, the quantization is accomplished in two or more clock cycles using a pipelined architecture. Thus, the analog input must be sampled and then held for several clock cycles to within the accuracy specified for the overall system. In fully parallel converters, the use of a track and hold amplifier significantly reduces the aperture and sampling uncertainties of the conversion, while at the same time easing the performance demands on the subsequent quantizer.

Track and hold amplifiers are also used to provide deglitching following digital-to-analog conversion. In video D/A converters, significant glitch energy may appear at the analog output, usually as a result of mismatch in the turn-on and turn-off of switches at major bit transitions. In applications such as CRT display drivers and signal generation in automatic test systems, it is often essential that D/A converter output transitions be monotonic and as smooth as possible.

High-performance track and hold circuits have traditionally been implemented in hybrid technologies that provide components such as open transmission lines for nearly 100% sampling efficiency, step recovery diodes for fast switching transitions, and low parasitic Schottky-diode bridges for use as sampling switches.

Hybrid implementations, however, are quite costly and complex with respect to monolithic implementations. It would be very desirable, therefore, to provide an improved BiCMOS track and hold amplifier which can be incorporated into a monolithic implementation.

SUMMARY OF THE INVENTION

It is an object of the present invention to provide for an improved BiCMOS track and hold amplifier.

The present invention provides various novel aspects over prior art approaches, including improved pedestal (injection) cancellation and feedthrough reduction capabilities.

In one embodiment, the present invention provides a BiCMOS track and hold apparatus comprising a transconductance input stage, an output stage (including an integrating amplifier and a holding capacitor, and a switching network for connecting the output of said input stage as an input to said output stage during track and hold modes of operation. The switching network includes a first transistor pair having a first impedance and a second transistor pair for providing a simulated impedance for the first transistor pair so as to reduce charge injection.

In another embodiment, the present invention provides a closed loop BiCMOS track and hold apparatus comprising a transconductance input stage, an output stage including an integrating amplifier and a holding capacitor (element), and a switching network for connecting the output of the input stage as an input to the output stage during track and hold modes of operation. The switching network includes a first transistor pair for switching data to the holding capacitor during a track mode of operation and for preventing passage of data during a hold mode of operation, and means for opening the closed loop before the input stage is grounded, including a single clock means for turning the first transistor off before the second transistor is grounded so as to reduce feedthrough during the hold mode of operation.

In still another embodiment, the present invention provides a BiCMOS track and hold apparatus comprising a first track and hold circuit including a transconductance input stage, an output stage including an integrating amplifier and a holding capacitor, a switching network for connecting the output of the input stage as an input to the output stage in track and hold modes of operation, wherein the first circuit has a first charge injection and the switching network includes a second (dummy) track and hold circuit for providing a second similar charge injection as the first circuit, and means for subtracting the second charge injection from the first charge injection.

In another embodiment, the present invention provides a BiCMOS track and hold apparatus comprising a transconductance input stage, an output stage including an integrating amplifier and a holding capacitor, a switching network for connecting the input stage to the output stage in track and hold modes of operation, where the switching network includes means for configuring the apparatus for multipurpose operations.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate an embodiment of the invention and, together with the description, serve to explain the principles of the invention.

DETAILED DESCRIPTION OF THE DRAWINGS

Reference will now be made in detail to the preferred embodiment of the invention, an example of which is illustrated in the accompanying drawings. While the invention will be described in conjunction with the preferred embodiment, it will be understood that it is not intended to limit the invention to that embodiment. On the contrary, it is intended to cover alternatives, modifications and equivalents, as may be included within the spirit and scope of the invention as defined by the appended claims.

Before going into a detailed description of the various embodiments of the present invention, a general overview of basic topologies for implementing track and hold circuits will now be described.

Figure 1A:
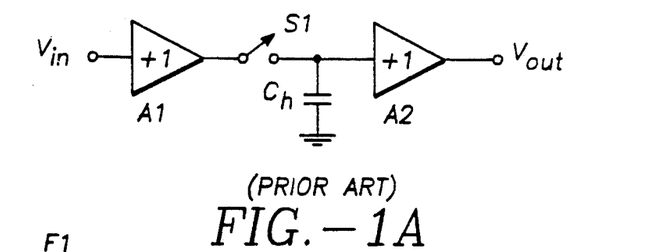
FIGS. 1A-1C show three topologies for implementing a track and hold circuit.
Figure 1B:
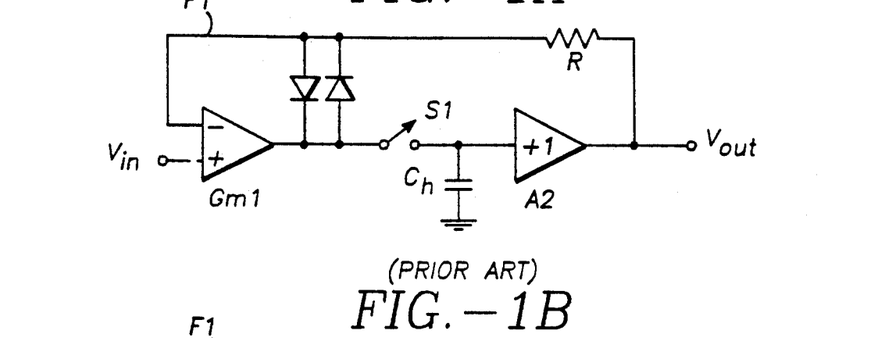
Figure 1C:
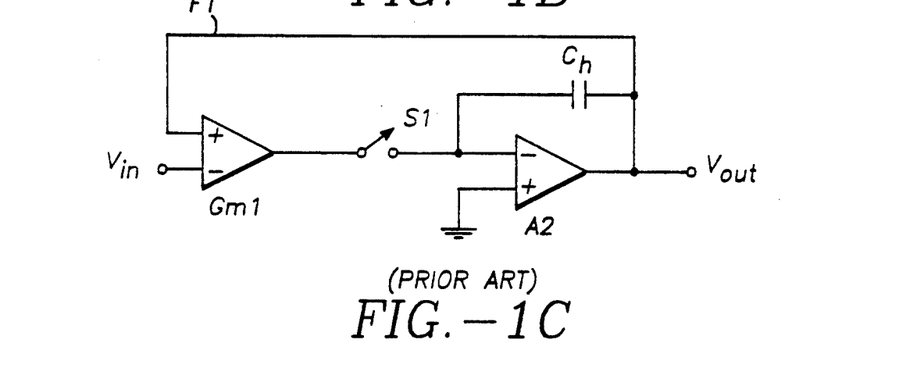

Three basic topologies for implementing a track and hold (T/H) circuit are illustrated in FIGS. 1A, 1B, and 1C. FIG. 1A is an open-loop configuration, while FIGS. 1B and 1C illustrate closed-loop architectures. In the open-loop design of FIG. 1A, the unity-gain input buffer A1 isolates the input Vin from the hold capacitance $C_h$, while the buffer A2 isolates $C_h$ from the output load impedance and provides the output current drive required for the overall amplifier. The principal advantage of this architecture is its speed. The open-loop configuration is intrinsically faster than closed-loop topologies because no feedback is employed and because the acquisition time at the hold capacitor $C_h$ is limited only by the input buffer A1 and the sampling switch bandwidth. However, the accuracy of the open-loop configuration is substantially lower than can be achieved with closed-loop alternatives for at least two reasons. First, the offsets and gain errors of the two unity-gain buffers A1 and A2 and the sampling switch S1 all appear unattenuated when referred to the input Vin. Second, both the input and output of the sampling switch S1 operate at the level of the input signal Vin. As a consequence, switch charge injection during turn-off and the switch on resistance will be signal dependent, thereby introducing both harmonic distortion and aperture delay uncertainty.

In the configuration of FIG. 1B, the closed feedback loop F1 and the gain of the input amplifier Gm1 serve to significantly reduce the input-referred offset and the gain error. However, as in the open-loop system, the sampling switch S1 input and output follow the input voltage Vin, resulting in signal-dependent charge injection. Moreover, the overall bandwidth of the system is reduced.

The closed-loop architecture of FIG. 1C consists of a transconductance input stage Gm1, the sampling switch S1, and an integrating amplifier A2, with low output impedance, all enclosed within the feedback loop F1. In this configuration, the input referred offset is substantially lower than that of open-loop systems, because all offsets other than that of the first stage are reduced by the gain of the transconductance amplifier Gm1. Also, the large feedback loop gain results in significantly lower closed-loop gain error and non-linearity than can be achieved in an open-loop system. Owing to the use of an integrating hold capacitor $C_h$ in the configuration of FIG. 1C, the input and output of the sampling switch S1 are always driven to virtual ground when the switch S1 is closed. The hold capacitance $C_n$ serves both to store the sample the hold mode and to provide frequency compensation of the overall amplifier in the track mode. The speed achievable with this topology remains lower than that of an open-loop configuration.

One aspect of the present invention provides charge injection cancellation on a single version of a track and hold circuit. Charge injection is error that is introduced at the output of a track and hold circuit when the switch driver goes to the hold mode.

Figure 1D:
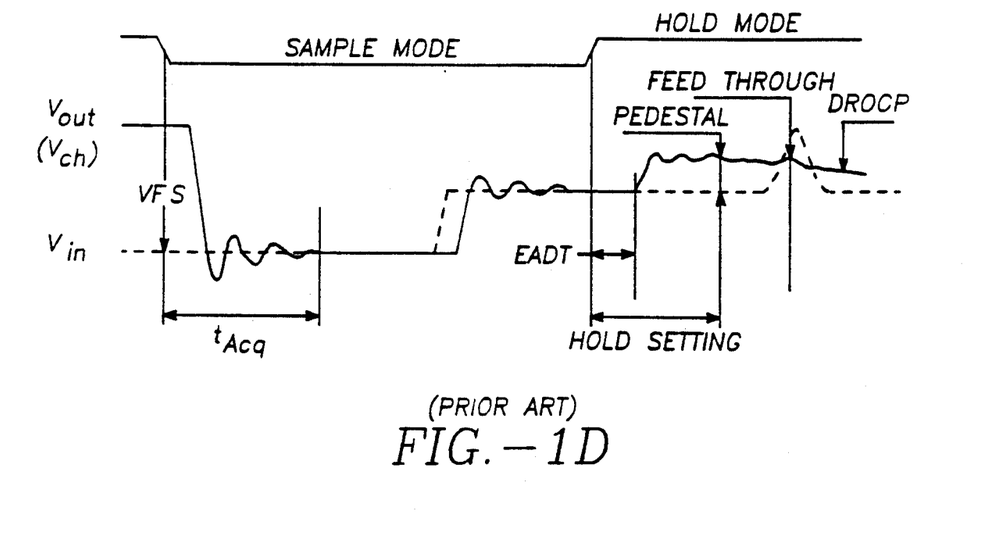
FIG. 1D shows a timing diagram of overall operation.

During track mode of operation, the output follows the input. However, during hold mode, ideally the output remains flat (this does not happen in reality). An error called pedestal error occurs as a result of charge injection of the sampling switch into the hold mode or holding element. Also, as the input during the hold mode varies, there is some signal variation at the output which is called feedthrough. The feedthrough and pedestal errors are seen in the overall timing operation of FIG. 1D. It is desired that very little of the signal at the input shows up at the output during hold mode. Also, while holding the data for too long, there is the occurrence of droop, as also shown in FIG. 1D.

Figure 3:
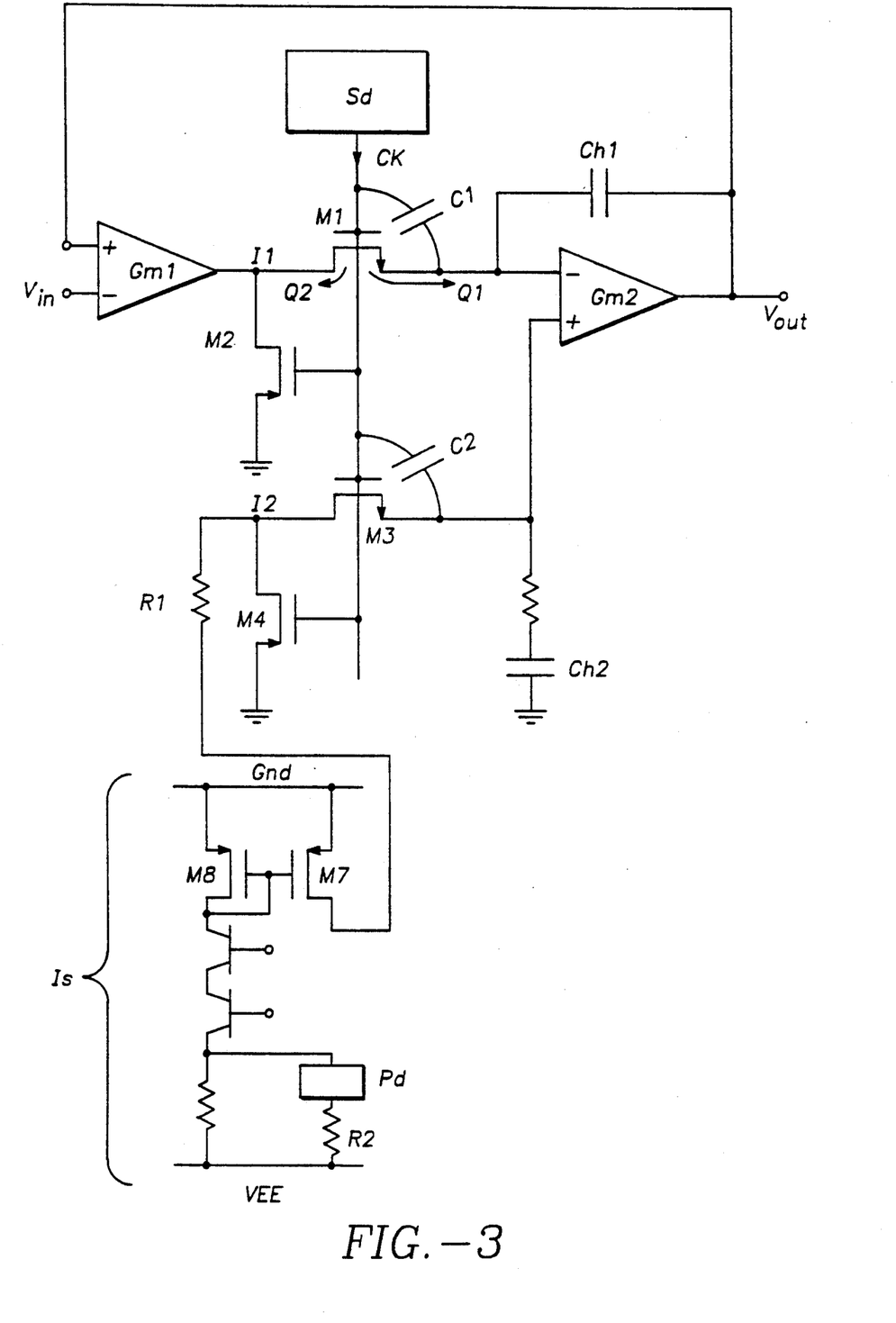
FIG. 3 depicts a schematic diagram of a switching circuit which forms a portion of FIG. 2.

In MOS sampling switches, there are two contributions of charge injection. As shown in FIG. 3, one is overlap capacitance C1 of the sampling switch M1 from the digital gate to the analog path, which comes in and puts charges into the holding element $C_h$ when the switch driver Sd output signal Ck goes low. The other element is as a result of inversion charges that stay within the device that gradually takes some time to go to both the source node and the drain node as the switch turns off. This charge which goes to the holding element is the one which causes the error.

The capacitive cross link (resulting from switch overlap capacitance) can be differentially canceled. The way it is done is by connecting switch M3 having overlap capacitance C2, as shown in FIG. 3, to the plus input of the second stage Gm2. The portion of the pedestal error that results from channel charges of the MOS switches will not be fully canceled. This is because the channel charges Q1, Q2 behave on what impedances are seen at the two nodes across from them. If the two are exactly equal, the charges Q1, Q2 will flow equal. If they are not equal, the charges Q1, Q2 will flow differently. In order to provide a cancellation of this problem, the present invention provides a mimicking (or simulation) at 12 of the impedance seen at the output 11 of the gain stage (Gm1).

Figure 2:
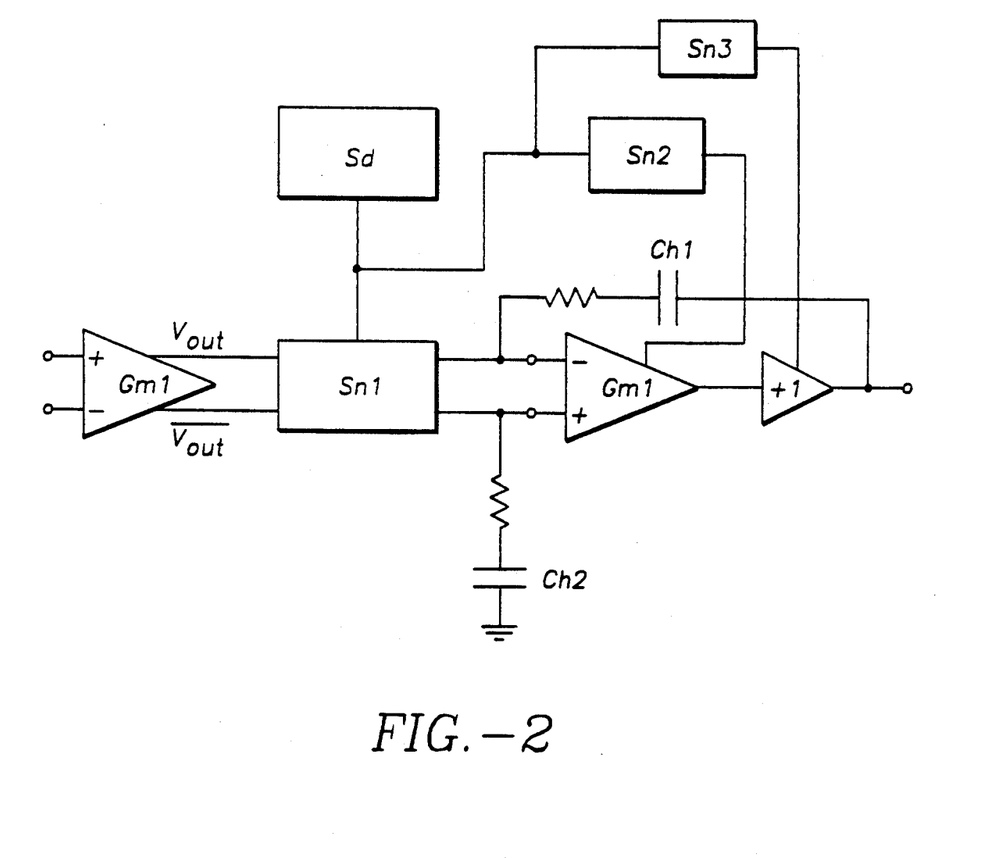
FIG. 2 depicts a block diagram of a track and hold architecture implemented with the present invention.

FIG. 2 shows a general block diagram of an improved track and hold amplifier incorporating aspects of the present invention. The circuit in FIG. 2 includes a transconductance input stage Gm1, a switch network Sn1, a holding capacitor $C_h$, and a second transconductance output stage Gm2. Other switch networks Sn2, Sn3 can be configured into the present invention shown in FIG. 2, as will be described later.

FIG. 3 shows a schematic diagram of the circuit of FIG. 2. The aspect of one embodiment of the present invention will now be described in connection with FIG. 3.

The switch network Sn1 of FIG. 3 is connected to the transconductance input stage Gm1 and to the output stage Gm2 through a pair of transistors M1, M2. The switch network stage Sn1 of FIG. 3 also includes a second pair of transistors M3, M4 together with a resistor network R1. The transistor pair M1, M2 are connected to the negative input of the output stage GM2 and the transistor pair M3, M4 are connected to the positive input of the output stage Gm2.

The use of transistor pair M3, M4 cancels charge injection because their overlap capacitance C2 cancels the effect of overlap capacitance C1. However, due to a mismatch of impedances seen at 11, 12, the charge injection due to channel charge may not cancel.

However, FIG. 3 shows how the present invention solves this problem. The present invention utilizes a poly resistor R1 with PMOS transistor M7 operating in a linear range, so that it mimics the impedance of the output I1 of the transconductance stage Gm1. The combination of resistor R1 and M7 transistor (operating in linear region) provides a purely resistive path with similar output impedance at I2 to that of transconductance input stage Gm1.

The resistance value of the MOS switch M7 is controlled by a current source Is. The value of the current can be changed externally because a pad Pd is available to the user. By terminating a resistor R2 to either Vee = −5 v or terminating resistor R2 to ground, the current can be adjusted. That in turn changes the value of the resistance of transistor M7. Therefore, this nullifies the charge injection by providing an impedance matching with that seen at the output I1 of the transconductance input stage Gm1. with R1 approximately −3 K, simulations show that the 100 mv of error is reduced to 1 mv, and experimentally varied to be as low as 5 mv. To provide better temperature tracking between the output impedance of the transconductance input stage and R1, transistor M7 is operated in a linear region with the same bias current temperature coefficient, thereby providing a resistance with similar temperature characteristics as that of the transconductance input stage Gm1 output impedance. An additional advantage of this implementation is that the emitter of transistor Q2 is connected to a pad and by changing resistor R2's value externally, the transistor M7 resistance can be changed, and therefore the pedestal error can be practically nullified.

Figure 4:
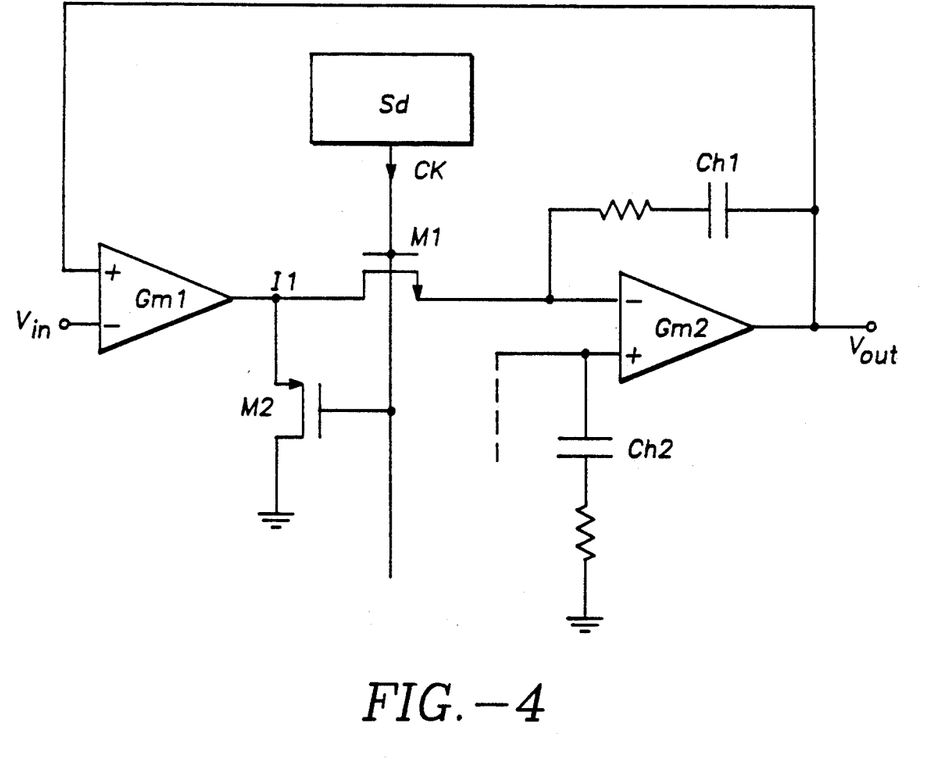
FIG. 4 shows a schematic diagram of an improved track and hold architecture for one aspect of the present invention.

A further aspect of the present invention in FIGS. 3 and 4 is feedthrough reduction. As the input analog voltage varies during a hold mode of operation, it is desirable to avoid any disturbances in the value being held during that time. In a real work environment, practical aspects are that some disturbance will be seen.

To reduce this feedthrough during a hold mode of operation, the output I1 of the transconductance stage Gm1 needs to be grounded. A clamp circuit using bipolar devices would not be very efficient at small signal levels and would only be workable for larger signals. Other techniques may require complementary non-overlapping clock signals. Indeed, the prior art approach was to use two different clock signals being delayed with respect to each other in order to provide feedthrough reduction.

However, using a single clock signal Ck, as shown in FIGS. 3 and 4, it must be such that first the loop must be opened by transistor M1 before the output I1 of the transconductance stage Gm1 is grounded by transistor M2. Otherwise, large errors may result. The circuit has the additional advantage of providing feedthrough reduction without degrading the jitter or charge cancellation characteristic described earlier.

As shown in FIG. 3, transistors M1, M3 are NMOS type transistors, and transistors M2, M4 are PMOS type transistors. Transistors M2, M4 are connected to ground, as seen.

In FIG. 3, using PMOS devices, transistors M2 and M4 ensure operation with a single clock signal Ck and also eliminates the need for a delay clock signal for opening switches M1, M3 before closing switches M2, M4. This is because the threshold voltage $V_t$ of NMOS transistors is $V_t = +0.8$ volts and PMOS transistors is $V_t = -0.8$ volts. And it will inherently take approximately 200 ps for the single clock signal to go from $+0.8$ volts to $-0.8$ volts. This aspect is shown in the timing diagram of FIG. 5.

Figure 5:
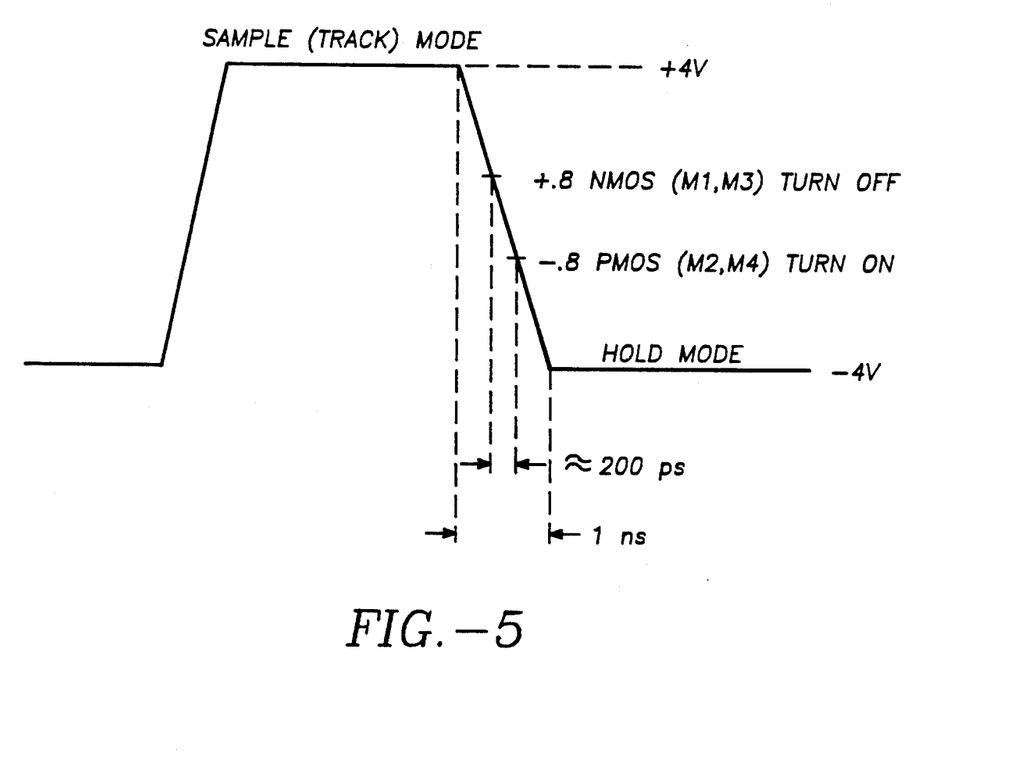
FIG. 5 depicts a timing diagram for the operation of FIG. 4.

As shown in FIG. 5, during the transition from the track (sample) mode to the hold mode the edge of the single clock signal Ck of the switch driver Sd goes from plus 4 volts to minus 4 volts. When the gates of transistors M1-M4 are at plus 0.8 volts, transistors M1, M3 will turn off, because the NMOS turns off when the voltage is lower than that, as seen in FIG. 5. However, transistors M2, M4 do not turn on until their gates reach minus 0.8 volts, as also seen in FIG. 5.

Thus, the present invention utilizes an inherent delay because there is a delay of one nanosecond from the transition from plus 4 volts to minus 4 volts. Typically, there is going to be about 200 picoseconds of delay between turn off of transistors M1, M3 and turn on of transistors M2, M4, which is inherent. This aspect guarantees a very simple switch driver. Therefore, feedthrough reduction can be accomplished without affecting data at the output.

Figure 6:
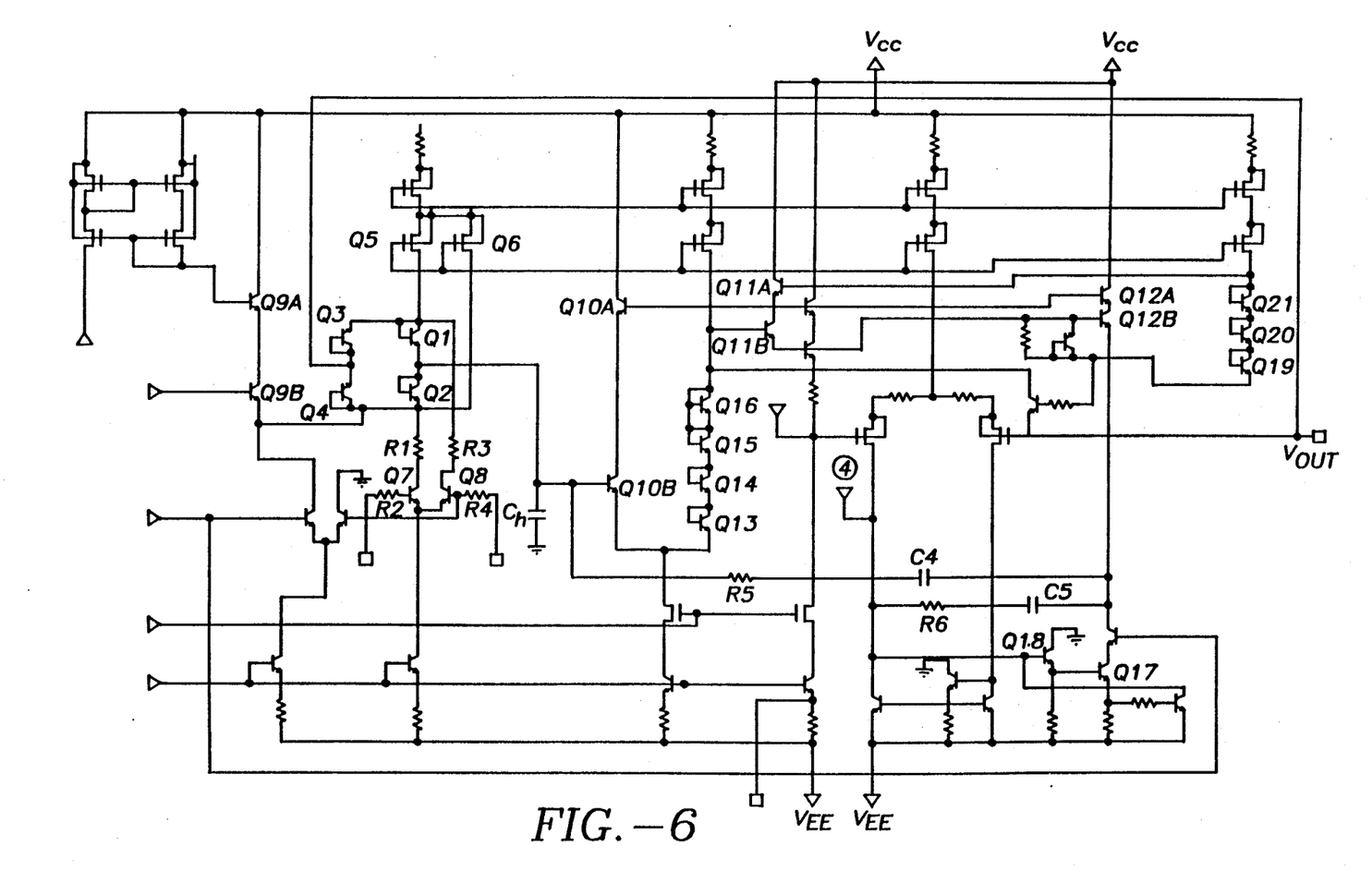
FIG. 6 depicts a schematic diagram for another aspect of the present invention.
Figure 7:
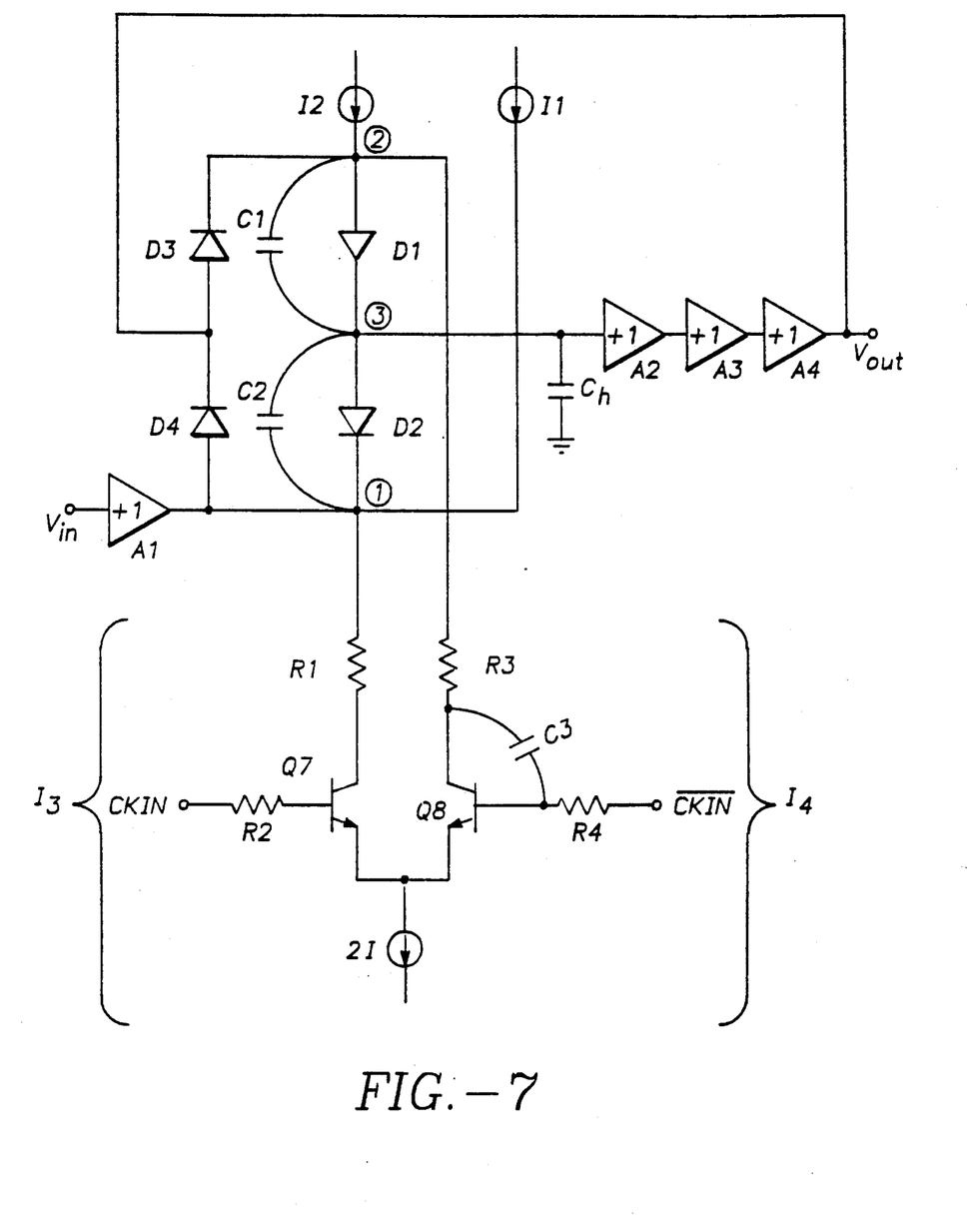
FIG. 7 depicts a further schematic diagram for still another aspect of the present invention.

FIG. 6 shows an open-loop track and hold circuit with bipolar switching for reducing charge injection. As shown in FIG. 7, charge injection occurs in a diode form of switch through the capacitive coupling C1, C2 of the diodes D1, D2.

As shown in FIG. 7, the circuit of FIG. 6 includes an input buffer A1, a sampling switch S1, a holding capacitor $C_h$, and three output buffers A2-A4. The input buffer A1 comprises the transistor pair Q9A, Q9B of FIG. 6. The sampling switch S1 comprises the transistors Q1-Q8 and the resistors R1-R4 of FIG. 6. The first output buffer A2 comprises the transistor pair Q10A, Q10B of FIG. 6. The second output buffer A3 comprises the transistor pair Q11A, Q11B of FIG. 6. And, the third output buffer A4 comprises the transistor pair Q12A, Q12B of FIG. 6.

Transistors Q1-Q4 of FIG. 6 are connected as diodes D1-D4, as shown in FIG. 7. Transistors Q5, Q6 of FIG. 6 form the current sources 11, 12 respectively of FIG. 7. The resistors R1, R2 together with the transistor Q7 of FIG. 6 form the current sink 13 of FIG. 7. The resistors R3, R4 together with the transistor Q8 of FIG. 6 form the current sink 14 of FIG. 7. Resistors R2, R4 provide the smoothing and filtering. Resistors R1, R3 are terminal resistors to provide matched charge injection.

The switch function is achieved during track mode with CKIN being high and $\overline{\text{CKIN}}$ being low. This turns on the transistor Q7 of the current sink 13 and the current 21 through the current sink 13 turns on the diodes D1, D2 such that there is a path from the input to the output.

During the hold mode the reverse will happen. Current is steered from the transistor Q7 to the transistor Q8. Current source 14 will pull up node 1 and with 21 current through Q2, the node 2 is pulled down and diodes D1 and D2 are reversed bias. With reverse bias, there is a high impedance at node 3.

If node 3 is at 0 volts, and with no clamping circuit such as D3-D4, there could be four volts of reverse voltage and capacitive coupling errors C1, C2 could be injected that are different from one another, which is an undesirable situation. It is desirable not to have input into the holding capacitor $C_h$ dependent upon charge injection. To reduce the reverse voltage swing and to make the input into the holding capacitor $C_h$ independent of pedestal errors, clamp diodes D3-D4 are provided at nodes 1 and 2 that will make this type of error limited. Specifically, in using diodes D3, D4, the value of charge injection due to the capacitive coupling C1, C2 is limited because the value of the voltage transition from track mode to hold mode is reduced.

In the track mode, node 1 is at $V_{in}-V_{be}$ (because of the voltage drop across the base-emitter junction of the input buffer transistor Q10B). However, in the hold mode it is pulled up by the current due to a hold mode signal. As soon as it reaches to $V_{be}$ above $V_{in}$, it will clamp so that it will only go to $V_{in}+V_{be}$. The amount of the traveling or transition value of the voltage is going to be $2V_{be}$ lower for hold mode to track mode and $2V_{be}$ higher for track mode to hold mode and independent of the input.

Diode D3, when node 2 is pulled down due to a hold signal, will start to turn on. In the track mode, node 2 is at $V_{in}+V_{be}$. However, when it goes to the hold mode, it goes to $1V_{be}$ below $V_{in}$, so that it is at $V_{in}-V_{be}$.

By making $2V_{be}$ the maximum voltage transition, the amount of charge injection is reduced. By having the two at a constant value, charge injection occurs in a diode form of switch through the capacitive coupling C1, C2 of diodes Di, D2.

Figure 8:
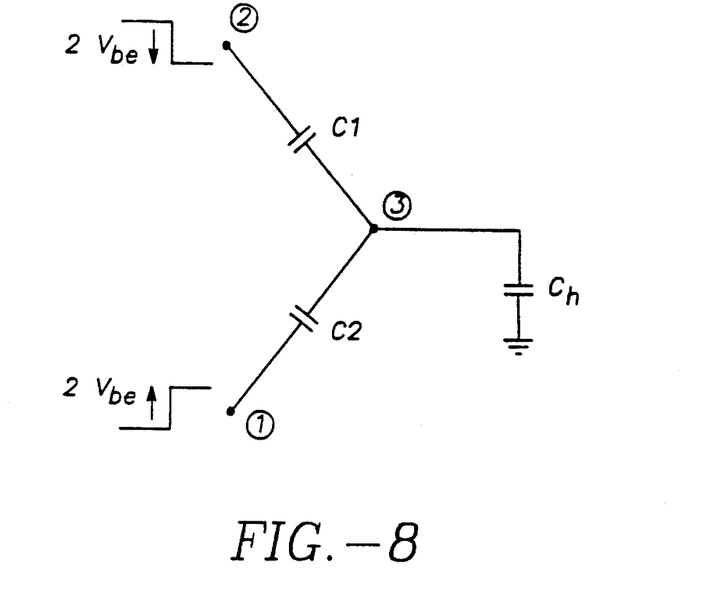
FIG. 8 depicts an equivalent model of FIG. 7.

An equivalent model is shown in FIG. 8. The error comes from the fact that node 2 is yanked down and node 1 is yanked up. If the value of the two capacitances C1, C2 are equal, the voltage at hold node 3 should not vary. Thus, if node 2 goes $2V_{be}$ lower and node 1 goes to $2V_{be}$ higher, the voltage at node 3 should not change and there will be achieved a very small amount of charge injection.

As far as charge injection is concerned, there are minor differences between the value current that pulls down or pulls up, mainly because of the fact that collector of Q2 is sitting at different voltage than the collector of Q1. In FIG. 7, a resistive path is placed in the circuitry designated resistors R1, R3 for matching the collector potential at the two nodes 4, 5. When the base of Q2 goes high to the hold mode, there is capacitive coupling C3 from its base to its collector that will induce more error than seen at the collector of Q1. The variation of the collector voltage of Q2 will cause the time of transition from the track mode to the hold mode to be different.

Resistors R2, R4 provide additional filtering that smooths out the fast transition edges of CKIN and $\overline{\text{CKIN}}$. The edges are typically in 1 nanosecond transitions, with a sampling rate of 20 megahertz. By slowing down through resistors R29, R30, there are smoother transitions.

An additional benefit of the clamp circuit D3-D4 is that it provides low impedances at nodes and 2, thereby reducing the feedthrough level that otherwise would reach to node 3 during hold node.

FIG. 6 shows a novel all NPN output stage that can drive a 50-ohm load. This output stage includes the input buffer A1 (transistor pair Q9A, Q9B), the sampling switch S1 (transistors Q1-Q8 and resistors R1-R4), a holding capacitor $C_h$, and three output buffers A2-A4 (transistor pairs Q10A, Q10B, and Q11A, Q11B, and Q12A, Q12B). The output stage also includes transistors Q13-Q21, resistors R5, R6, and capacitors C4, C5.

The four transistors Q13-Q16 provide four diode level shifts.

The two transistors Q17, Q18 comprise a class AB final output stage which prevents transconductance degradation at varying load conditions. The feed forward node 4 brings forward the inverted output of the amplifier A2 of FIG. 1A and 1B. The feed forward path bypasses the three stages of the emitter followers Q9B, Q10B, and Q11B. It bypasses all of those stages and dumps the signal (an inverted version of the output) of the amplifier A2 of FIGS. 1A and 1B into the node and carries it very quickly through Q17 and Q18 to the output, therefore improving the phase margin and frequency performance of the output buffer.

Additionally, feed forward resistor R5 and feed forward capacitor C4 are used from the base of Q10B to the output that further improves the phase margin degradation of the output buffer stages. Capacitive coupling and compensation as provided by R6 and C5 speed up Class AB output stage which maintains the current at the emitter of Q12B from no load to full load condition. As with a voltage of one volt at the output to $-1$ volt, the current in Q17 varies in such a way that current to Q12B is always maintained constant. This is important when trying to stabilize the overall system as the transconductance of Q12B varies with the current load, which could cause instability.

An additional feature of the output stage is when used in open loop track and hold configuration, additional circuitry is implemented with Q19-Q21, with their current sources associated. Therefore, if the collectors of Q12A, Q11A, and Q10A are sent back through a bootstrapping technique, this reduces the output transconductors and therefore improves linearity. This concept will now be described below.

In analog technologies, early voltages (VA) used to be about 200 volts. In the present systems, the voltages are only about 20 or 10 volts, which means that the output impedances are reduced by a factor of 10 to 20.

This automatically interprets into more non-linearities associated with digital technology. In order to improve that, with emitter follower Q1 (FIG. 9), the collector of Q1 follows the voltage level of the emitter of Q1. There will be much less induced current into the output impedance $R_{out}$, therefore automatically improving the overall equivalent output impedance. The way it can be done is to come up with a level shift of diode D1, D2, and feed a low current source where I1 is greater than I2, with a follower Q2.

Figure 9:
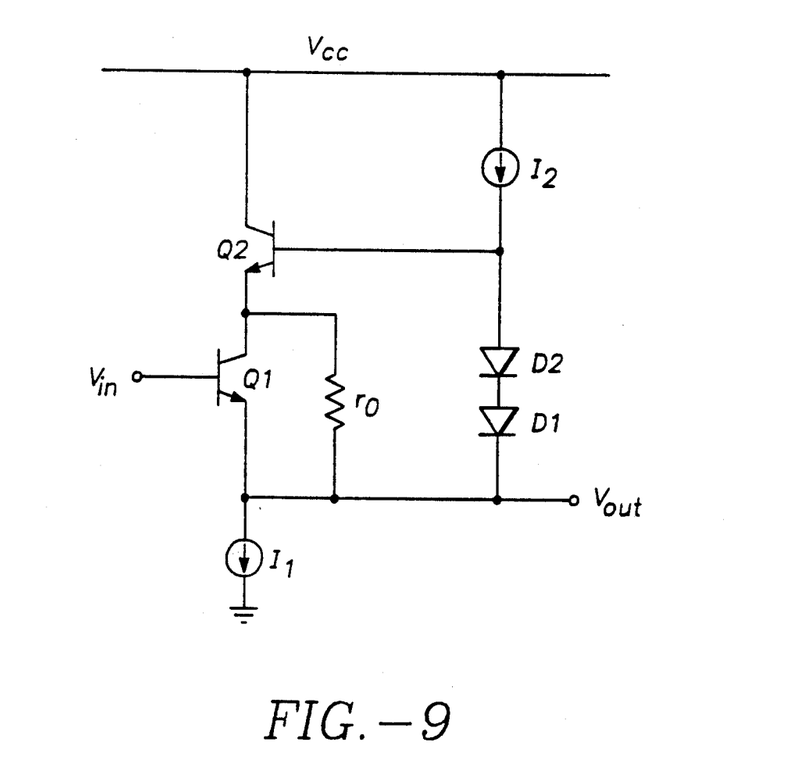
FIG. 9 depicts a further schematic diagram of a novel aspect of the present invention.

What happens is that the emitter of Q1 and the collector of Q1 shift together. Therefore, if the emitter goes by 0.1 volt, the collector of Q1 is 0.1 volt. The circuitry of D1, D2, I2 and Q2 assure that the collector of Q1 goes up by 0.1 volts, so that the induced current is near zero, which means that the equivalent output impedance is very high. Still another aspect of the present invention is related to the charge injection cancellation in a dual configuration. If it is desired for additional reduction in charge injection, FIG. 10 shows a preferred embodiment of such an implementation.

Figure 10:
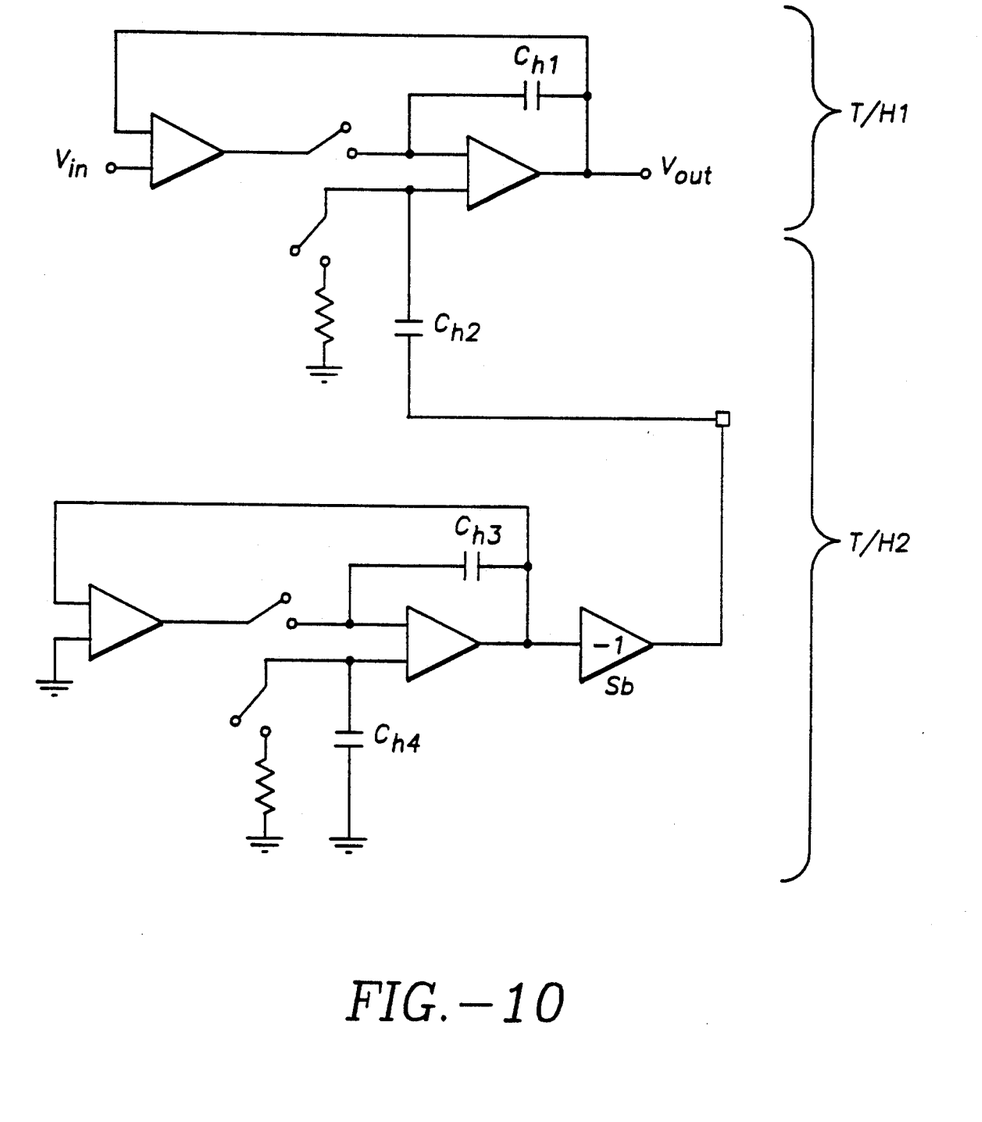
FIG. 10 depicts a further schematic diagram for another feature of the present invention.

A dummy track and hold circuit T/H2 in FIG. 10 is used to provide similar charge injections to that of the main track and hold circuit T/H1. The result passes through an open loop subtractor stage Sb with gain $=1$. The dummy capacitor $C_{h2}$ is available to a pad that the subtractor Sb output connects to, and thereby reduces the charge injection with 4% matching (approximately 0.2 millivolts).

In FIG. 10, the main track and hold circuit T/H1 is used to look at an input signal Vin and gives output Vout. The dummy version of the track and hold circuit T/H2 has its input VDin at ground, as shown in FIG. 10.

Because the sampling switch of the dummy track and hold T/H2 is operating at a virtual ground, it is not dependent on the input voltage at all. The output VDout of the dummy track and hold is just the charge injection errors, because there is no input signal Vin associated with it. Therefore, every time it goes to a hold mode, there is only charge injection.

Subtractor block Sb also has a pad that drives CH2. By going through the subtractor Sb to give a gain of −1, inverting the signal, the voltage will pull down the common node 1 of the second stage of the main track and hold circuit T/H1 and in an opposite direction of what actual charge injection due to the dummy track and hold circuit T/H2 will result. Therefore, nullifying the effects of charge injection at the output Vout to below a half-millivolt or so. If a user starts with 5 millivolts charge injection from each of these with 10% matching, the 5 millivolt charge injection is reduced to half a millivolt. With 1% matching (which is more of a normal operation), the charge injection can be reduced to 0.05 mV at the output.

Further aspects of the present invention are that several multi-purpose configurations can be obtained essentially from the same master-slice with only changes in the last masks. To implement this particular aspect, extra components (with an increase in die size) are laid out that are not used in one version and utilized in other versions.

For example, aspects of the present invention utilized in a video track and hold environment utilize a larger percentage of the die area. Two master-slices implemented for a single version of a product can utilize the addition of a subtractor for increased DC accuracy.

Each master-slice can be configured into different track and hold architectures, including closed loop and open loop. Each track and hold configuration can be used in different product applications, such as video track and hold, video cable driver, voltage translator and wideband amplifiers.

The circuit structure described above provides further aspects in terms of an architecture. By adding a slight overhead (perhaps 30%) in die area, different types of functions are available which are suitable for different markets and totally different functions.

For sampling systems, this provides a two-gain stage. With two-gain stages utilized in a particular configuration, very high and good accuracy is achieved. However, in other applications where settling time is more of a factor, the present invention can provide single stage track and hold with shorter settling time. A single open loop track and hold according to the present invention provides enough drive ability with a small amount of circuitry, such that the speed is much higher (in a range of 15 nanoseconds).

A track and hold function is similar when it is in a track mode to an operational amplifier (op amp). When it is in unity gain, it is very close to a cable driver. These functions can be provided by simple reconfiguration of the system shown in the drawings.

If a loop is closed, a unity gain buffer is provided. Similarly, a cable driver configuration can be achieved in a straightforward fashion. If a loop is opened, an operational amplifier capability is provided.

As shown in the Figures, the power supplies pins and pads are generally in the same area, so that the output goes from the same pad for the same types of products (albeit different). Therefore, testing the product or all of the products is going to be similar. Power supplies are generated in the same manner.

The present invention therefore provides commonality for an op amp, a track and hold, a voltage follower, or a cable driver type product.

The foregoing description of the preferred embodiment of the invention has been presented for purposes of illustration and description. It is not intended to be exhaustive or to limit the invention to the precise form disclosed, and many modifications and variations are possible in light of the above teaching. The preferred embodiment was chosen and described in order to best explain the principles of the invention and its practical applications to thereby enable others skilled in the art to best utilize the invention and various embodiments and with various modifications as are suited to the particular use contemplated. It is intended that the scope of the invention be defined by the Claims appended hereto.

What is claimed is:

1. A track and hold apparatus having a track mode and a hold mode, said track and hold apparatus comprising:
   an input stage having an input terminal for receiving an input signal;
   an output stage having an input terminal and an output terminal;
   a holding capacitor coupled to said input terminal of said output stage;
   an NMOS transistor coupled between said output terminal of said input stage and said input terminal of said output stage, said NMOS transistor turned on during said track mode and turned off during said hold mode;
   a PMOS transistor coupled between said output terminal of said input stage and ground, said PMOS transistor turned on during said hold mode and turned off during said track mode; and
   a switch driver for turning said NMOS and PMOS transistors on and off, said switch driver generating a single clock signal received by both said NMOS and PMOS transistors, said single clock signal turning said NMOS transistor off before turning said PMOS transistor on during transition from said track mode to said hold mode.

2. A track and hold apparatus having a track mode and a hold mode, said track and hold apparatus comprising:
   an input stage having an input terminal and an output terminal, said input terminal of said input stage for receiving an input signal, said input stage having an output impedance;
   an output stage having a first and second input terminal and an output terminal;
   a first holding capacitor coupled to said first input terminal of said output stage;
   a second holding capacitor coupled to said second input terminal of said output stage;
   a first switch coupled between said output terminal of said input stage and said first input terminal of said output stage, said first switch turned on during said track mode and turned off during said hold mode;
   a second switch coupled between said output terminal of said input stage and ground, said second switch turned on during said hold mode and turned off during said track mode;
   a circuit having an output terminal and an output impedance, said output impedance of said circuit matching said output impedance of said input stage;

a third switch coupled between said second input terminal of said output stage and said output terminal of said circuit, said third switch turned on during said track mode and turned off during said hold mode; and a fourth switch coupled between said output terminal of said circuit and ground, said fourth switch turned on during said hold mode and turned off during said track mode.

3. The track and hold apparatus of claim 2 further comprising a switch driver for turning said first, second, third, and fourth switches on and off, said switch driver generating a single clock signal received by said first, second, third, and fourth switches, said single clock signal turning said first and third switches off before turning said second and fourth switches on during transition from said track mode to said hold mode.

4. The track and hold apparatus of claim 2 wherein:

said first switch comprises a first transistor coupled between said output terminal of said input stage and said first input terminal of said output stage, said first transistor turned on during said track mode and turned off during said hold mode;

said second switch comprises a second transistor coupled between said output terminal of said input stage and ground, said second transistor turned off during said track mode and turned on during said hold mode;

said third switch comprises a third transistor coupled between said second input terminal of said output stage and said output terminal of said circuit, said third transistor turned on during said track mode and turned off during said hold mode;

said fourth switch comprises a fourth transistor coupled between said output terminal of said circuit and ground, said fourth transistor turned off during said track mode and turned on during said hold mode.

5. The track and hold apparatus of claim 4, further comprising a switch driver for turning said first, second, third, and fourth transistors on and off, said switch driver generating a single clock signal received by said first, second, third, and fourth transistors, said single clock signal turning said first and third transistors off before turning said second and fourth transistors on during transition from said track mode to said hold mode.

6. The track and hold apparatus of claim 5 wherein:

said first and third transistors are NMOS type transistors; and said second and fourth transistors are PMOS type transistors.

7. The track and hold apparatus of claim 6 wherein: said circuit comprises:

a resistor having a first terminal and a second terminal, said third transistor coupled between said first terminal of said resistor and said second input terminal of said output stage;

a fifth transistor; and means for controlling a current through said fifth transistor to match said output impedance of said circuit with said output impedance of said input stage, said fifth transistor coupled between said second terminal of said resistor and said means for controlling current.

8. A track and hold apparatus having a track mode and a hold mode, said track and hold apparatus comprising:

a main track and hold circuit comprising:

a first input stage having an input terminal and an output terminal, said input terminal of said first input stage for receiving an input signal;

a first output stage having a first and a second input terminal and an output terminal;

a holding capacitor coupled to said first input terminal of said first output stage; and a first switch coupled between said output terminal of said first input stage and said first input terminal of said first output stage, said first switch turned on during said track mode and turned off during said hold mode, said first switch creating a charge injection into said holding capacitor during transition from said track mode to said hold mode; and a dummy track and hold circuit comprising:

a first dummy holding capacitor coupled to said second input terminal of said output stage of said main track and hold circuit;

means for creating a dummy charge injection into said first dummy holding capacitor during transition from said track mode to said hold mode;

a dummy inverting stage coupled between said first dummy holding capacitor and said means for creating said dummy charge injection.

9. The track and hold apparatus of claim 8 wherein said means for creating said dummy charge injection comprises:

a dummy input stage having an input terminal and an output terminal, said input terminal of said dummy input stage coupled to ground;

a dummy output stage having an input terminal and an output terminal;

a second dummy holding capacitor coupled to said input terminal of said output stage;

a dummy switch coupled between said output terminal of said dummy input stage and said first input terminal of said dummy output stage, said dummy switch turned on during said track mode and turned off during said hold mode.

10. The track and hold apparatus of claim 9 wherein:

said first input stage has a second input terminal;

said main track and hold circuit has a feedback loop coupled between said output terminal of said first output stage and said second input terminal of said first input stage;

said first holding capacitor is coupled between said first input terminal and said output terminal of said first output stage;

said dummy input stage has a second input terminal;

said dummy track and hold circuit has a feedback loop coupled between said output terminal of said dummy output stage and said second input terminal of said dummy input stage; and said second dummy holding capacitor is coupled between said input and output terminals of said dummy output stage.

11. A track and hold apparatus having a track mode and a hold mode, said track and hold apparatus comprising:

an input buffer having an input terminal and an output terminal;

an output buffer having an input terminal and an output terminal;

a holding capacitor having a first terminal and a second terminal, said first terminal coupled to said input terminal of said output buffer, said second terminal coupled to ground;

a first current source connected to said output terminal of said input buffer;

a first current sink connected to said output terminal of said input buffer, said current sink turned on during said track mode and turned off during said hold mode;

a second current source;

a second current sink connected to said second current source, said current sink turned off during said track mode and turned on during said hold mode;

a first diode connected between said second current source and said first terminal of said holding capacitor;

a second diode connected between said first terminal of said holding capacitor and said first current sink;

a third diode; and a feedback loop having a first terminal and a second terminal, said output terminal of said output buffer connected to said first terminal of said feedback loop, said third diode connected between said second terminal of said feedback loop and said second current source.

12. The track and hold apparatus of claim 11 wherein said switch further comprises a fourth diode connected between said output terminal of said input buffer and said second terminal of said feedback loop.

13. The track and hold apparatus of claim 12 wherein said first, second, third, and fourth diodes are bipolar transistors connected as diodes.

* * * * *